United States Patent
Park et al.

(10) Patent No.: US 6,565,736 B2
(45) Date of Patent: May 20, 2003

(54) WET PROCESS FOR SEMICONDUCTOR DEVICE FABRICATION USING ANODE WATER CONTAINING OXIDATIVE SUBSTANCES AND CATHODE WATER CONTAINING REDUCTIVE SUBSTANCES, AND ANODE WATER AND CATHODE WATER USED IN THE WET PROCESS

(75) Inventors: Im-soo Park, Seoul (KR); Kun-tack Lee, Suwon (KR); Young-min Kwon, Suwon (KR); Sang-rok Hah, Seoul (KR); Woo-gwan Shim, Seoul (KR); Hyung-ho Ko, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/945,722

(22) Filed: Sep. 5, 2001

(65) Prior Publication Data

US 2002/0027084 A1 Mar. 7, 2002

(30) Foreign Application Priority Data

Sep. 6, 2000 (KR) ........................ 2000-52661

(51) Int. Cl.$^7$ .............................................. C02F 1/461
(52) U.S. Cl. ..................... 205/746; 205/748; 134/1.3
(58) Field of Search ..................... 205/748; 134/1.3, 134/26

(56) References Cited

U.S. PATENT DOCUMENTS

| | | | |
|---|---|---|---|
| 5,593,554 A | | 1/1997 | Yamanaka et al. |
| 5,616,221 A | * | 4/1997 | Aoki et al. ................. 205/746 |
| 5,762,779 A | * | 6/1998 | Shiramizu et al. ......... 205/746 |
| 6,277,266 B1 | * | 8/2001 | Yamaoka .................... 205/746 |

FOREIGN PATENT DOCUMENTS

JP 10-062399 3/1998

* cited by examiner

Primary Examiner—Arun S. Phasge

(57) ABSTRACT

A wet process performed in the manufacture of semiconductor devices with cathode water and anode water produced from electrolyte using a 3-cell electrolyzer having an intermediate cell for the electrolyte. The 3-cell electrolyzer includes an anode cell, a cathode cell, and an intermediate cell between the anode and cathode cells, which are partitioned by ion exchange membranes. Deionized water is supplied into the anode and cathode cells, and the intermediate cell is filled with an electrolytic aqueous solution to perform electrolysis. The anode water containing oxidative substances or the cathode water containing reductive substances, which are produced by the electrolysis process, are used in the wet process.

23 Claims, 11 Drawing Sheets

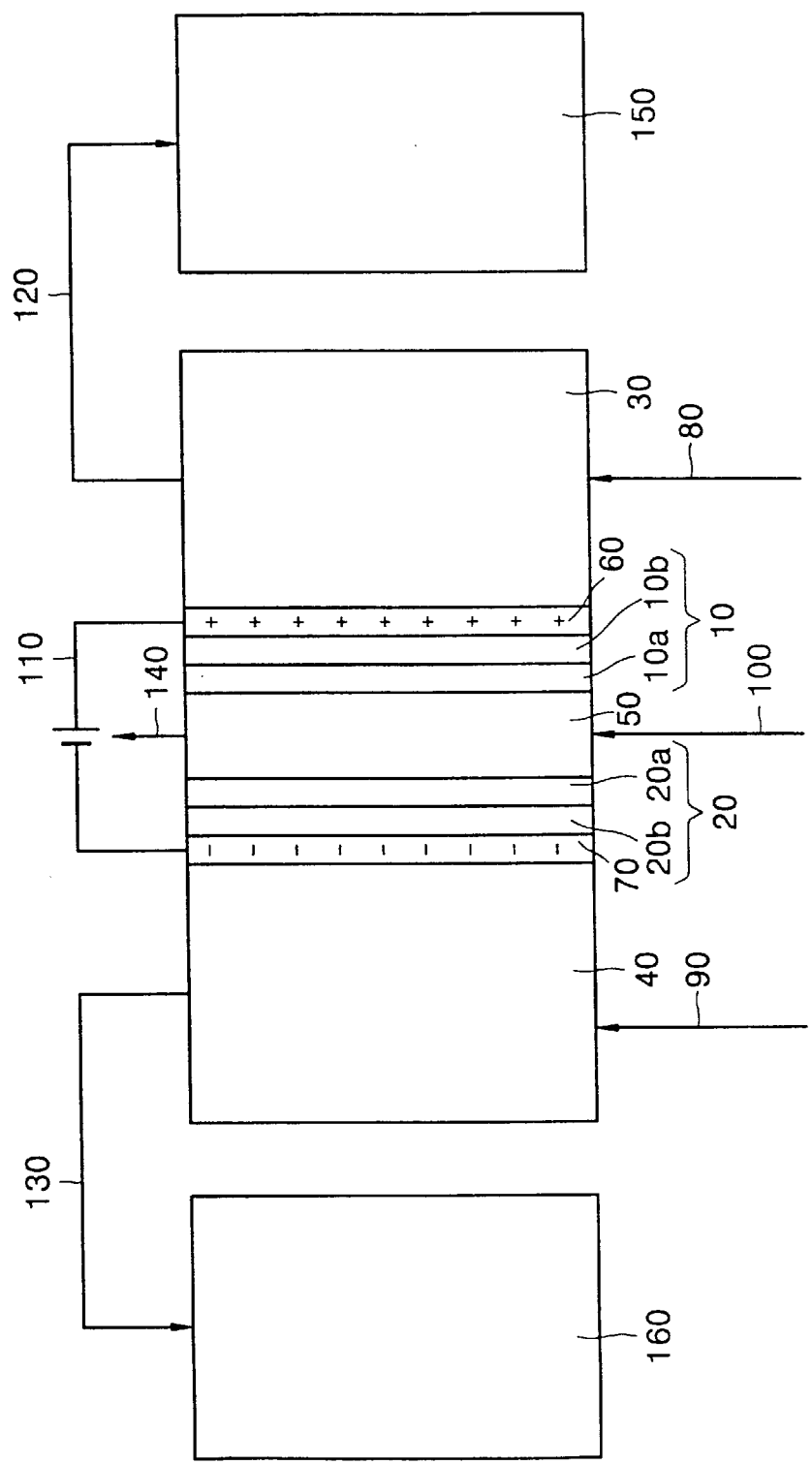

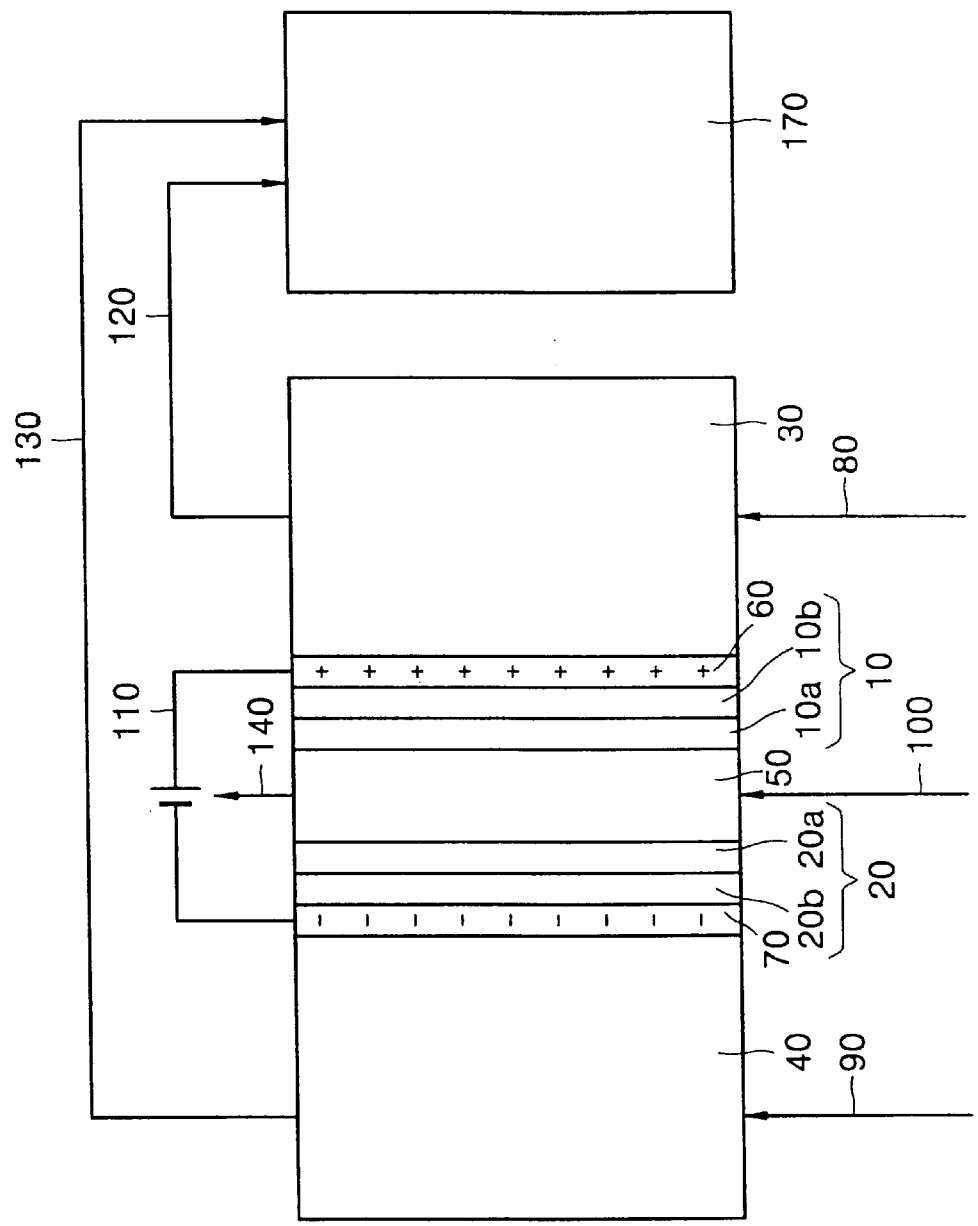

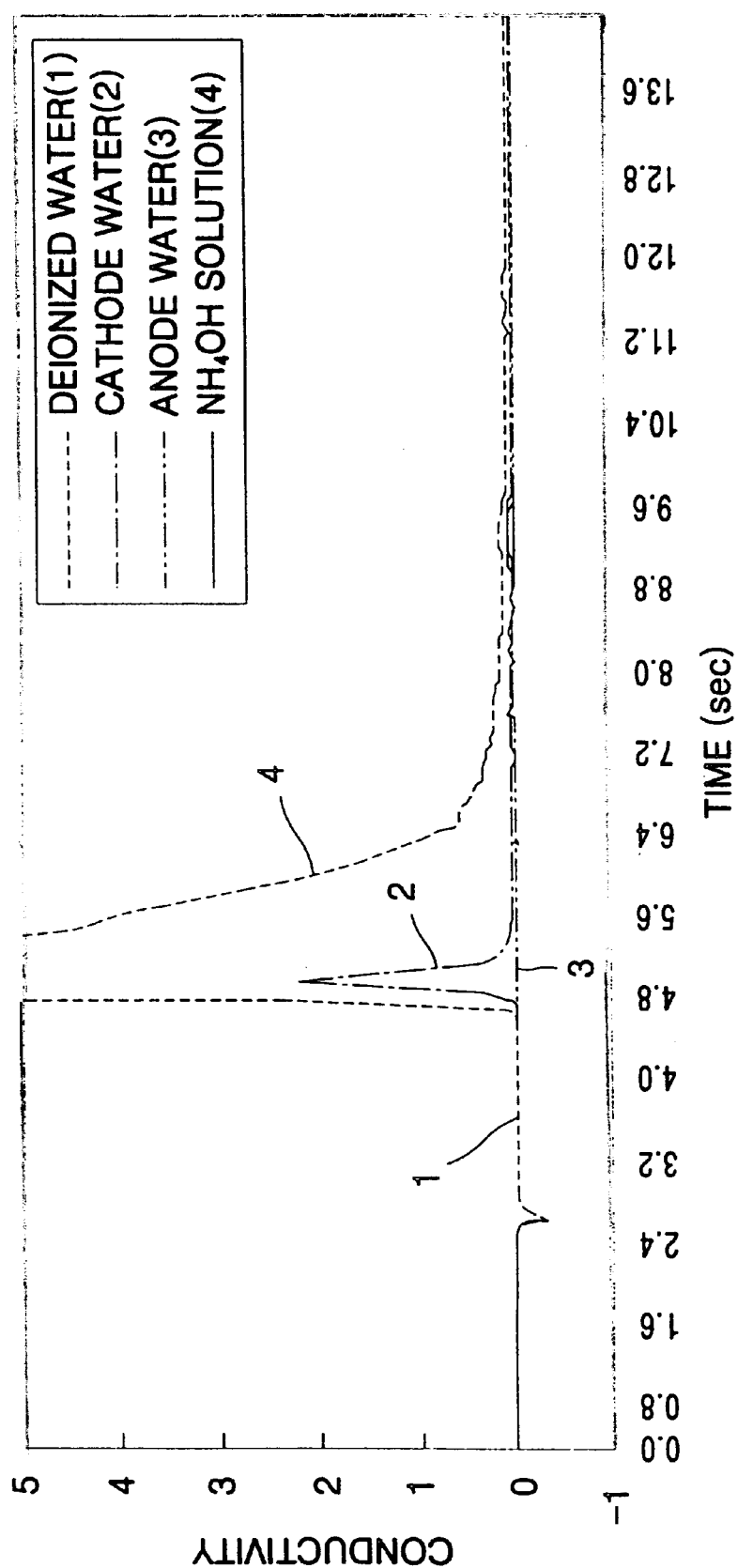

WET PROCESS FOR SEMICONDUCTOR DEVICE FABRICATION USING ANODE WATER CONTAINING OXIDATIVE SUBSTANCES AND CATHODE WATER CONTAINING REDUCTIVE SUBSTANCES, AND ANODE WATER AND CATHODE WATER USED IN THE WET PROCESS

BACKGROUND OF THE INVENTION

1. Field of the Invention

The present invention relates to wet processes for semiconductor device fabrication using at least one of cathode water and anode water, and also the cathode water and anode water produced by electrolysis, which is used in the wet processes.

2. Description of the Related Art

A variety of wet processes using a large amount of chemicals, such as wet-etching, cleaning and rinsing processes, are performed several times to manufacture a complete semiconductor device. For example, in a particle removal or cleaning process, a "Standard Cleaning Solution (SC1)" is widely used, which is a mixture of ammonium hydroxide, hydrogen peroxide, and water. In addition, a sulfuric peroxide mixture (SPM), which is used to remove polymers or organic byproducts resulting from a dry etching process to form a metal interconnect, or contact hole or via, is a mixture of sulfuric acid and hydrogen peroxide.

Unfortunately, these cleaning solutions can damage metal layers exposed to the solutions. Furthermore, since such large amounts of chemicals are used during the manufacture of semiconductor devices, there is a continuing desire to reduce the amount of the chemicals used, to thereby reduce manufacturing costs and comply with environmental and ecological initiatives.

The use of electrolytic ionized water in wet processes associated with the semiconductor device fabrication has been introduced, for example, in U.S. Pat. Nos. 5,824,200 and 5,616,221. As taught in these disclosures, the amount of chemicals used in wet processes can be significantly reduced if the electrolytic ionized water is used together with the chemicals, which ensures environment-friendly wet processes. In particular, U.S. Pat. No. 5,824,200 ('200 patent) produces electrolytic ionized water by directly supplying electrolytes into a cathode cell or anode cell. U.S. Pat. No. 5,616,221 ('221 patent) uses electrolytic cathode or anode water obtained by performing a preliminary electrolysis and further adding another electrolyte.

For the '200 patent, however, corrosion of the electrolyzer is a problem due to the direct supply of electrolyte into the cathode or anode cell, so that the resulting ionized water contains a large amount of metals or particles. For the '221 patent, an ammonia electrolyte is added to the effluent cathode water from the cathode cell, whereas a hydrochloric acid electrolyte is added to the effluent anode water from the anode cell. Accordingly, when there is a need to use both the cathode water and anode water for a wet process, the preparation process becomes complicated due to a variety of considerations, and the amount of electrolytes that are used increases.

Therefore, it would be desirable to perform wet processes with an appropriate electrolytic ionized water that can be produced with a small amount of electrolyte through a simple process without generating contaminants.

SUMMARY OF THE INVENTION

It is an object of the present invention to provide a wet process used in the fabrication of a semiconductor device, where the wet process uses at least one of anode water containing oxidative substances and cathode water containing reductive substances, wherein the anode water and cathode water are produced with a small amount of electrolyte through a simple process without generating contaminants, and are readily applied to the wet process.

It is another object of the present invention to provide anode water containing oxidative substances, and cathode water containing reductive substances, for use in wet processes for semiconductor device fabrication.

The present invention is achieved by a wet process performed with cathode water and anode water produced by electrolyzing an electrolyte in a 3-cell electrolyzer. The 3-cell electrolyzer includes an anode cell, a cathode cell, and an intermediate cell between the anode and cathode cells, which are partitioned by ion exchange membranes.

It is preferable that an ion exchange membrane between the cathode cell and the intermediate cell includes an anionic exchange membrane adjacent to the intermediate cell and a fluorine-based cationic exchange membrane adjacent to the anode cell. An ion exchange membrane between the cathode cell and the intermediate cell may include a cationic exchange membrane adjacent to the intermediate cell and an anionic exchange membrane adjacent to the cathode cell.

Deionized water is supplied into the anode cell and the cathode cell of the 3-cell electrolyzer and the intermediate cell is filled with an electrolytic aqueous solution to perform electrolysis. At least one of the anode water containing oxidative substances, or the cathode water containing reductive substances, which are produced by the electrolysis, are used in a wet process.

In one embodiment, the electrolytic aqueous solution is a 3–15% by weight ammonium hydroxide solution. In this case, the anode water may have a pH of 7–9, and an oxidation-reduction potential of +100 mV or more, and the cathode water may have a pH of 9 or more, and an oxidation-reduction potential of –500 mV or less.

In another embodiment, the electrolytic aqueous solution is a 3–15% by weight hydrochloric acid solution. In this case, the anode water may have a pH of 4 or less, and an oxidation-reduction potential of +700 mV or more, and the cathode water may have a pH of 3–5, and an oxidation-reduction potential of –100 mV or less.

In still another embodiment, the electrolytic aqueous solution is a mixture of 1–30% by weight ammonium hydroxide and 1–30% by weight fluoride-containing solution. The fluoride may be a hydrogen fluoride or ammonium fluoride. In this case, the anode water may have a pH of 6 or less, and an oxidation-reduction potential of +300 mV or more.

BRIEF DESCRIPTION OF THE DRAWINGS

The above objects and advantages of the present invention will become more apparent by describing in detail preferred embodiments thereof with reference to the attached drawings in which:

FIG. 1A is a schematic view of a wet process system equipped with an electrolyzer for producing anode water and cathode water to be used in wet processes;

FIG. 1B is a schematic view of a modification of the wet process system of FIG. 1A;

FIG. 9 is a graph comparatively showing the ammonium ion concentration of deionized water, the oxidative substance containing anode water, and reductive substance containing cathode water electrolyzed from 3% by weight ammonium hydroxide solution using the electrolyzer of FIG. 1A, and a hydrogen ammonium solution diluted to have the same pH as the cathode water.

DETAILED DESCRIPTION OF THE INVENTION

Figure 2:
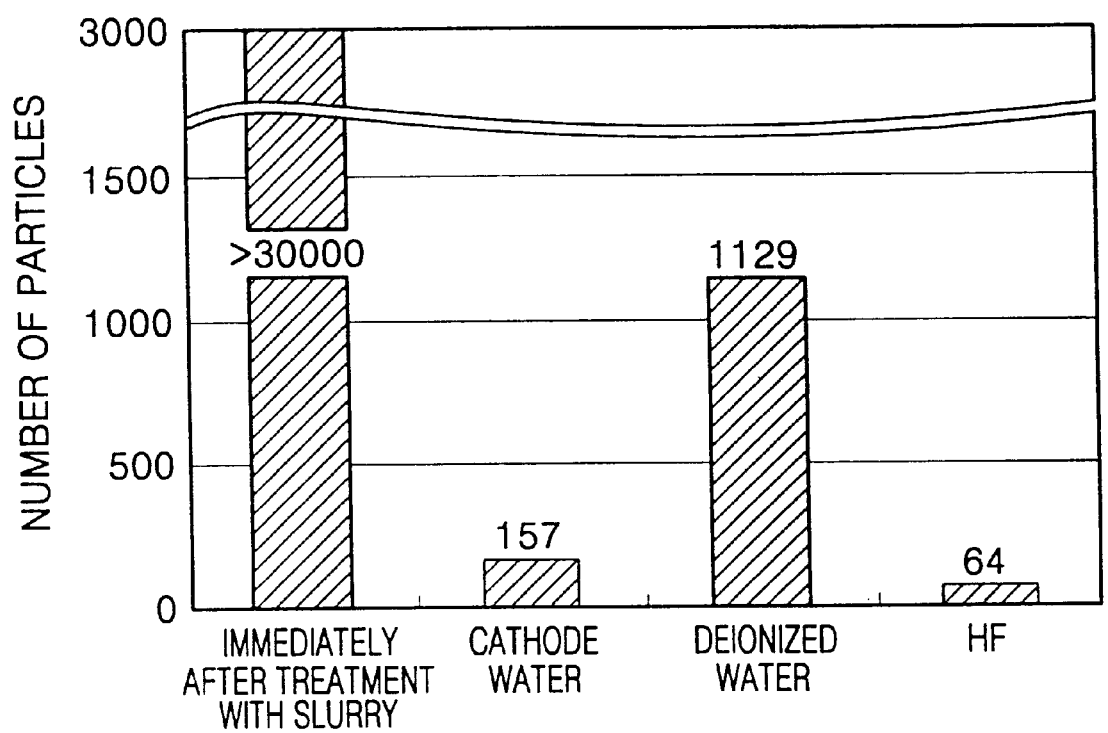
FIG. 2 is a graph comparatively showing the particle removal capabilities of the cathode water containing reductive substances, which is electrolyzed from 3% by weight ammonium hydroxide solution using the electrolyzer of FIG. 1A, deionized water, and a hydrogen fluoride solution.

The present invention will now be described more fully with reference to the accompanying drawings, in which preferred embodiments of anode water and cathode water used in wet processes, and the wet processes performed with the anode water and cathode water, are shown. This invention may, however, be embodied in many different forms and should not be construed as being limited to the embodiments set forth herein. Rather, these embodiments are provided so that this disclosure will be thorough and complete, and will fully convey the concept of the invention to those skilled in the art. The electrolyzers shown in the drawings are roughly illustrated for convenience, and the same reference numerals are used to designate the same elements throughout the drawings.

Referring to FIG. 1A, an electrolyzer for use in wet processes during semiconductor device fabrication according to the present invention is sectioned into an anode cell 30, a cathode cell 40, and an intermediate cell 50 by ion exchange membranes 10 and 20. The ion exchange membrane 10 for the anode cell 30 is comprised of an anionic exchange membrane 10a and a fluorine-based cationic exchange membrane 10b. The ion exchange membrane 20 for the cathode cell 40 is comprised of a cationic exchange membrane 20a and an anionic exchange membrane 20b. These configurations of the ion exchange membranes 10 and 20 are beneficial to produce anode water and cathode water with desired properties, for example, in terms of pH and oxidation-reduction potential (ORP).

It is preferable that the fluorine-based cationic exchange membrane 10b has uniform pin holes to allow the anions dissociated in the intermediate cell 50 to fully migrate into the anode cell 30. In a similar way, it is preferable that the anionic exchange membrane 20b has uniform pin holes to allow the cations dissociated in the intermediate cell 50 to fully migrate into the cathode cell 40.

An anode 60 is installed in contact with the ion exchange membrane 10, and particularly, with the fluorine-based cationic exchange membrane 10b, in the anode cell 30, whereas a cathode 70 is installed in contact with the ion exchange membrane 20, and particularly, with the anionic exchange membrane 20b, in the cathode cell 40.

Deionized water is supplied into the anode cell 30 and the cathode cell 40 through first and second inlet lines 80 and 90, respectively, at a predetermined flow rate. An electrolytic aqueous solution having a predetermined concentration is supplied into the intermediate cell 50 through a third inlet line 100 until the third cell 50 is filled up. As a current flows from the anode 60 to the cathode 70 with application of DC power 110, electrolysis of the electrolytic aqueous solution begins in the intermediate cell 50. The flow rate of deionized water supplied, and the electrolysis current level are varied according to the capacity of the electrolyzer used.

Once anode water containing oxidative substances is produced in the anode cell 30 through the electrolysis, the anode water is transferred into a first wet process system 150 for use in a wet process through a first outlet line 120. At the same time, cathode water containing reductive substances which is produced in the cathode cell 40 is transferred into a second wet process system 160 for use in a wet process through a second outlet line 130. Reference numeral 140 denotes an outlet line for the electrolytic aqueous solution remaining in the intermediate cell 50.

A variety of wet process systems can be applied as the first and second wet process systems 150 and 160, for example, a simple spin apparatus, a deionized water-based sonic spin apparatus, a steam jet apparatus, a spray apparatus, a simple dip apparatus, a batch-type megasonic dip apparatus, a single-wafer type megasonic dip apparatus, and a single-wafer type megasonic spin apparatus.

Although the cathode water and anode water are supplied into the distinct wet process systems 150 and 160, respectively, in FIG. 1A, the first outlet line 120 for the anode water, and the second outlet line 130 for the cathode water can be connected to the same wet process system 170, as shown in FIG. 1B, wherein the anode water and cathode wafer are supplied into the wet process system 170 in sequence.

The preferred embodiments of the present invention are described according to the electrolyte supplied into the intermediate cell 50. In the first embodiment, an ammonium hydroxide solution is used as the electrolyte filling the intermediate cell 50. In particular, deionized water is supplied into the anode cell 30 and the cathode cell 40 at a predetermined flow rate, for example, at a rate of 1 L/min, and the intermediate cell 50 is filled with 3–15% by weight ammonium hydroxide solution. Then, a DC power 110 is applied to induce a predetermined electrolysis current, preferably, at 10A, between the anode 60 and the cathode 70, for electrolysis.

During the electrolysis, the anode 60 of the anode cell 30 serves as an electron acceptor for the deionized water supplied into the anode cell 30, and the cathode 70 of the cathode cell 40 serves as an electron donor for the deionized water supplied into the cathode cell 40. The electrolyte supplied into the intermediate cell 50 is dissociated into anions (OH$^-$) and cations (NH$_4$$^+$), and the anions migrate into the anode cell 30, and the cations migrate into the cathode cell 40. The reactions in each of the cells 30 and 40 are expressed as follows.

<Reactions at the Anode>
(1) $2H_2O-4e^- \leftrightharpoons 4H^+ + O_2$
(2) $2H_2O-4e^- \leftrightharpoons H_2O_2 + 2H^+$
(3) $H_2O+O_2-4e^- \leftrightharpoons O_3 + 2H^+$
(4) $2OH^- - 4e^- \leftrightharpoons 2H_2O + O_2$ <Reactions at the Cathode>
(1) $2H_2O + 2e^- \leftrightharpoons H_2 + 2OH^-$
(2) $2H^+ + 2e^- \leftrightharpoons H_2$
(3) $H_2O + e^- \leftrightharpoons OH^- + H^+$
(4) $H^+ + e^- \leftrightharpoons H$ As shown in the reaction schemes illustrated above, the anode water produced in the anode cell 30 contains oxidative substances, such as H$^+$, O$_2$, and O$_3$, as major components, whereas the cathode water produced in the cathode cell 40 contains reductive substances, such as NH$^{4+}$, OH$^-$ and H$_2$, as major components.

The anode water containing the oxidative substances has a pH of 7–9, and an ORP of +100 mV or more, preferably +100–600 mV. The cathode water containing the reductive substances has a pH of 9 or more, preferably 9–13, and an ORP of −500 mV or less, preferably −900−−500 mV. Accordingly, both the anode water and cathode water are effective in removing particles, metallic contaminants, metallic polymers, or organic substances. In particular, the anode water is effective in removing metallic contaminants, metallic polymers, and organic substances, and the cathode water is effective in removing particles or metallic polymers.

A wet process performed in the first wet process system 150 with the anode water discharged through the first outlet line 120, and a wet process performed in the second wet process system 160 with the cathode water discharged through the second outlet line 130 include the following processes: (i) a cleaning process performed after gate oxide layer formation, (ii) a cleaning process performed after metal layer deposition, (iii) a cleaning process performed after chemical mechanical polishing (CMP) of a metal layer, (iv) a cleaning process performed after etching of a metal layer, polysilicon layer or polysilicide layer, (v) a cleaning process performed after etching an opening through which a metal layer, polysilicon layer, or silicide layer is exposed, and (vi) a cleaning process of a layer (for example, oxide layer) with an underlying metal layer. Suitable metal layers associated with the cleaning processes include a copper layer, tungsten layer, tungsten silicide layer, titanium layer, and titanium nitride layer.

The electrolysis system shown in FIG. 1B also produces cathode water and anode water through the same electrolysis process illustrated with reference to FIG. 1A. In this case, the produced anode water and cathode water are alternately supplied into the single wet process system 170. This configuration of the wet processing apparatus 170, which allows easy alternate flows of cathode water and anode water, is suitable for a surface potential adjustment process, or a rinsing process performed with other cleaning solutions after a cleaning process.

According to a second embodiment of the present invention, 3–15% by weight hydrochloric acid solution is used as an electrolytic aqueous solution filling the intermediate cell 50 for a wet process. The electrolysis is carried out under the same processing conditions as in the first embodiment, for example, with the same electrolysis current level at the same flow rate of deionized water.

The electrolyte supplied into the intermediate cell 50 is dissociated into anions (Cl$^-$) and cations (H$^+$), and the anions migrate into the anode cell 30, and the cations migrate into the cathode cell 40. The reactions in each of the cells 30 and 40 are expressed as follows.

<Reactions at the Anode>
(1) $2H_2O-4e^- \leftrightharpoons 4H^+ + O_2$
(2) $2H_2O-4e^- \leftrightharpoons H_2O_2 + 2H^+$
(3) $H_2O+O_2-2e^- \leftrightharpoons O_3 + 2H^+$
(4) $2Cl^- - 2e^- \leftrightharpoons Cl_2$ <Reactions at the cathode>
(1) $2H_2O + 2e^- \leftrightharpoons H_2 + 2OH$
(2) $2H^+ + 2e^- \leftrightharpoons H_2$
(3) $H_2O + e^- \leftrightharpoons OH^- + H^+$
(4) $H^+ + e^- \leftrightharpoons H$ As shown in the reaction schemes illustrated above, the anode water produced in the anode cell 30 contains oxidative substances, such as H$^+$, O$_2$, and O$_3$, as major components, whereas the cathode water produced in the cathode cell 40 contains reductive substances, such as OH$^-$ and H$_2$, as major components.

The anode water containing the oxidative substances has a pH of 4 or less, preferably 2–4, and an ORP of +700 mV or more, preferably +700–+1200 mV. The cathode water containing the reductive substances has a pH of 3–5, and an ORP of −100 mV or less, preferably −500−−100 mV. Accordingly, both the anode water and cathode water are effective in removing particles, metallic contaminants, metallic polymer, or organic substances. In particular, the anode water is effective in removing metallic contaminants, metallic polymer, and organic substances, whereas the cathode water is effective in removing particles or metallic polymer.

Like the first embodiment, a wet process performed in the first wet process system 150 with the anode water discharged through the first outlet line 120, and a wet process performed in the second wet process system 160 with the cathode water discharged through the second outlet line 130 include the following processes: (i) a cleaning process performed after gate oxide layer formation, (ii) a cleaning process performed after metal layer deposition, (iii) a cleaning process performed after chemical mechanical polishing (CMP) of a metal layer, (iv) a cleaning process performed after etching of a metal layer, polysilicon layer or polysilicide layer, (v) a cleaning process performed after etching an opening through which a metal layer, polysilicon layer, or silicide layer is exposed, and (vi) a cleaning process of a layer (for example, an oxide layer) with an underlying metal layer.

Suitable metal layers associated with the cleaning processes include a copper layer, tungsten layer, tungsten silicide layer, titanium layer, and titanium nitride layer.

The cathode water is more suitable in rinsing a semiconductor wafer performed with other cleaning solutions after the cleaning processes described above.

As described in the first embodiment, the electrolyzer shown in FIG. 1B also produces cathode water and anode water through the same electrolysis process, except that 3–15% by weight hydrochloric acid solution is used as an electrolyte filling the intermediate cell 50. In this case, the produced anode water and cathode water are alternately supplied into the single wet process system 170. This configuration of the wet process system 170 can be applied for surface potential adjustment process, or a rinsing process performed with other cleaning solutions after a cleaning process.

According to a third embodiment of the present invention, a solution containing 1–15% by weight ammonium hydroxide and 1–30% by weight fluoride solution is used as an electrolytic aqueous solution filling the intermediate cell 50 for a wet process. The electrolysis is carried out under the same processing conditions as in the first embodiment, for example, with the same electrolysis current level at the same flow rate of deionized water. It is preferable that the fluoride is hydrogen fluoride or ammonium fluoride.

The electrolyte supplied into the intermediate cell 50 is dissociated into anions ($F^-$ and $OH^-$) and cations ($H^+$ and $NH_4^+$), and the anions migrate into the anode cell 30, and the cations migrate into the cathode cell 40. The reactions in each of the cells 30 and 40 are expressed as follows.

<Reactions at the Anode>
(1) $2H_2O-4e^- \leftrightarrows 4H^+ + O_2$
(2) $2H_2O-4e^- \leftrightarrows H_2O_2 + 2H^+$
(3) $H_2O + O_2 - 2e^- \leftrightarrows O_3 + 2H^+$
(4) $2F^- - 2e^- \leftrightarrows F_2$
(5) $2OH^- - 4e^- \leftrightarrows 2H_2O + O_2$ <Reactions at the Cathode>
(1) $2H_2O + 2e^- \leftrightarrows H_2 + 2OH^-$
(2) $2H^+ + 2e^- \leftrightarrows H_2$
(3) $H_2O + e^- \leftrightarrows OH^- + H^+$
(4) $H^+ + e^- \leftrightarrows H^{\cdot}$ As shown in the reaction schemes illustrated above, the anode water produced in the anode cell 30 contains oxidative substances, such as $H^+$, $O_2$, $O_3$, and $F_2$, as major components, whereas the cathode water produced in the cathode cell 40 contains reductive substances, such as $OH^-$, $H^{\cdot}$, $H_2$, and $NH^{4+}$, as major components.

The anode water containing the oxidative substances has a pH of 6 or less, preferably 3–6, and an ORP of +300 mV or more, preferably +300–+800 mV. The cathode water containing the reductive substance has a pH of 8, and an ORP of –400 mV or less. Accordingly, both the anode water and cathode water are effective in removing particles, metallic contaminants, metallic polymers, or organic substances. The anode water is more suitable for wet processes in terms of its pH level and ORP characteristic.

The first wet process system 150 into which the anode water is supplied through the first outlet line 120 is used for the following processes: (i) a cleaning process performed after metal layer deposition, (ii) an etching process of a metal layer, or (iii) a cleaning process performed after etching of an opening through which a metal layer is exposed. The metal layer is preferably formed of an aluminum layer.

The present invention will be described in greater detail by means of the following examples, which are illustrative purposes and are not intended to limit the scope of the invention.

EXPERIMENTAL EXAMPLE 1

Evaluation of Particle Removal Capability of Cathode Water Electrolyzed from Ammonium Hydroxide A silicon oxide layer was deposited to a thickness of 6,000 Å over three separate semiconductor wafers. Then, to prepare samples, the semiconductor wafers were contacted with a chemical mechanical polishing (CMP) slurry, rather than being fully polished. The number of particles distributed over the semiconductor wafers was counted using a counter (SurfScan 6420, manufactured by Tencor Co.). As shown in FIG. 2, the number of particles on the wafer was greater than 30,000 immediately after treatment with the slurry.

Meanwhile, deionized water was supplied into both the cathode cell 30 and the anode cell 40 at a rate of 1 L/min, and the intermediate cell 50 was filled with 3% by weight ammonium hydroxide solution. Electrolysis was carried out with application of a DC power 110 to induce a 10A current flow between the cathode 60 and the anode 70, thereby resulting in cathode water containing reductive substances, and anode water containing oxidative substances.

One of the three wafers was treated with the cathode water having a pH of 9–10, and an OPR of –600 to –700 mV for 30 seconds. Then, the number of particles on the semiconductor wafer were counted. Another semiconductor wafer was treated with deionized water, and the remaining semiconductor wafer was treated with a 0.1% hydrogen fluoride solution, each for 30 seconds. Then, the number of particles remaining on each semiconductor wafer was counted. The results are shown in the graph in FIG. 2. As shown in FIG. 2, the particle removal capability of the cathode water is excellent (only 157 particles remaining from the 30,000+ initial particles), especially compared to the deionized water (1129 particles remaining from the 30,000+ initial particles). The wafer cleaned by the hydrogen fluoride solution had 64 particles remaining from the 30,000+ initial particles.

EXPERIMENTAL EXAMPLE 2

Figure 3A:
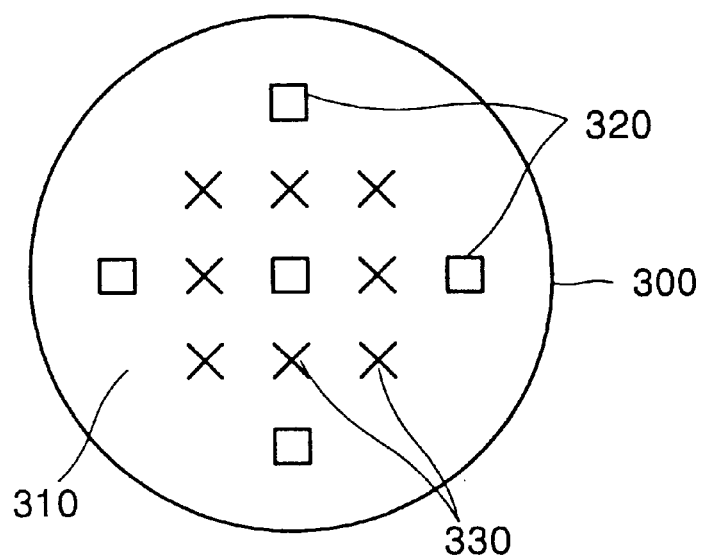
FIG. 3A is a plan view illustrating the measurement points over a wafer for metal residue measurement.
Figure 3B:
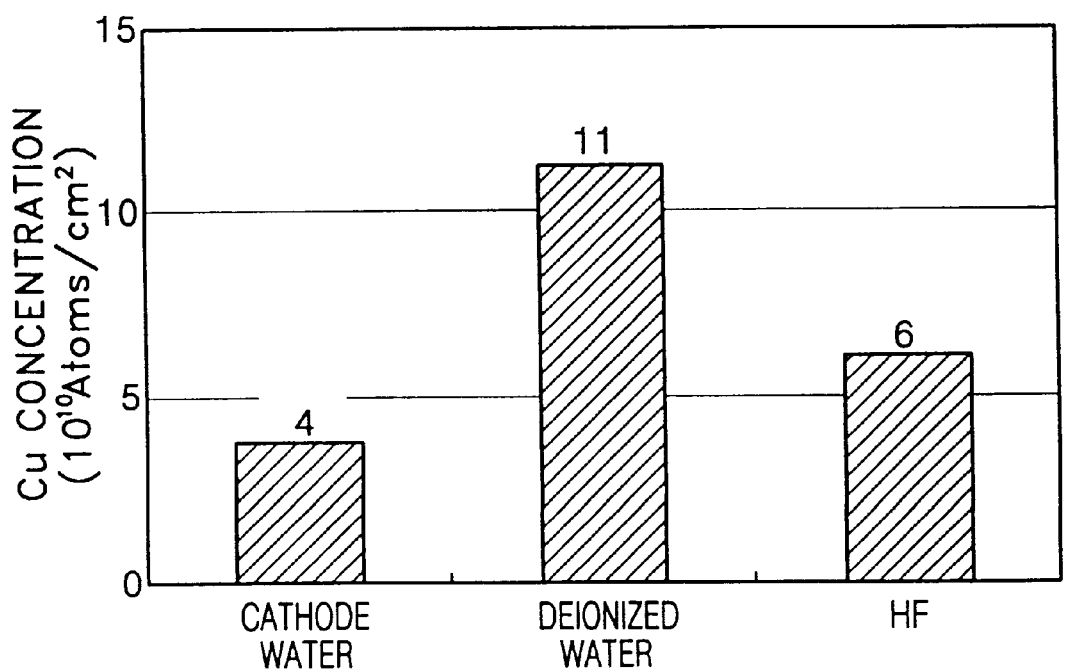
FIG. 3B is a graph comparatively illustrating the copper removal capabilities of the cathode water containing reductive substances, which is electrolyzed from 3% by weight ammonium hydroxide solution using the electrolyzer of FIG. 1A, deionized water, and a hydrogen fluoride solution.
Figure 4A:
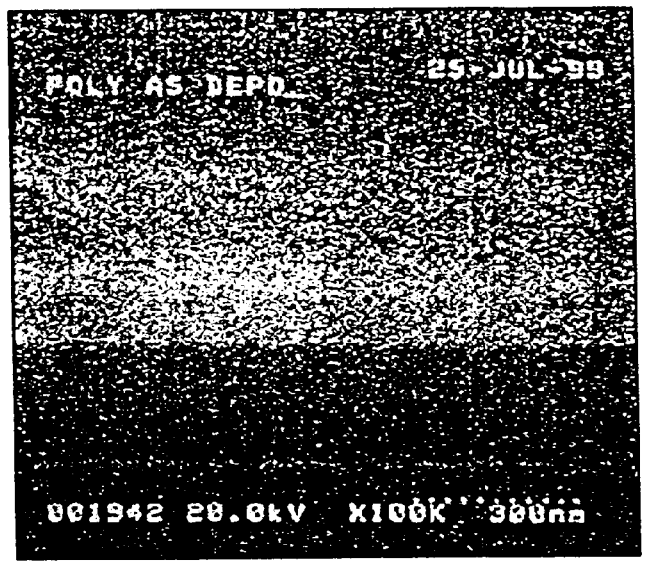
FIGS. 4A, 5A, 6A, and 7A are scanning electron microscope (SEM) photos of the surfaces of a recently formed polysilicon layer, tungsten silicide layer, tungsten layer, and copper layer, respectively.
Figure 4B:
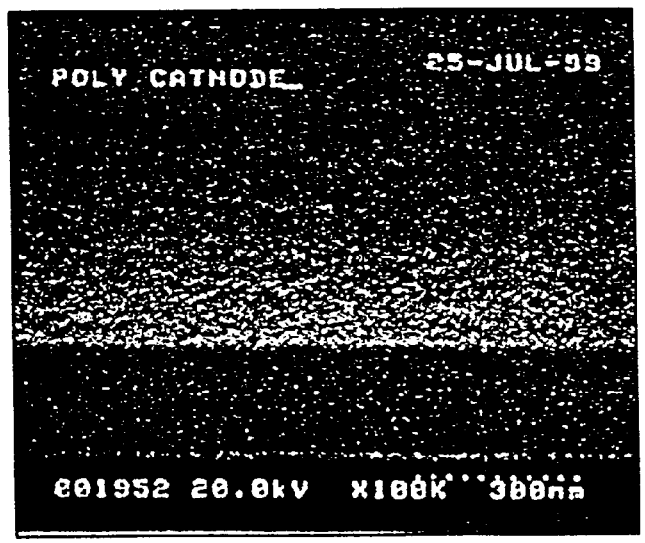
FIGS. 4B, 5B, 6B, and 7B are SEM photos of the surfaces of the layers of FIGS. 4A, 5A, 6A, and 7A after a 10-minute immersion into the reductive substance containing cathode water electrolyzed from 3% by weight hydrogen ammonium solution using the electrolyzer of FIG. 1A, respectively.
Figure 5A:
Figure 5B:
Figure 6A:
Figure 6B:
Figure 7A:
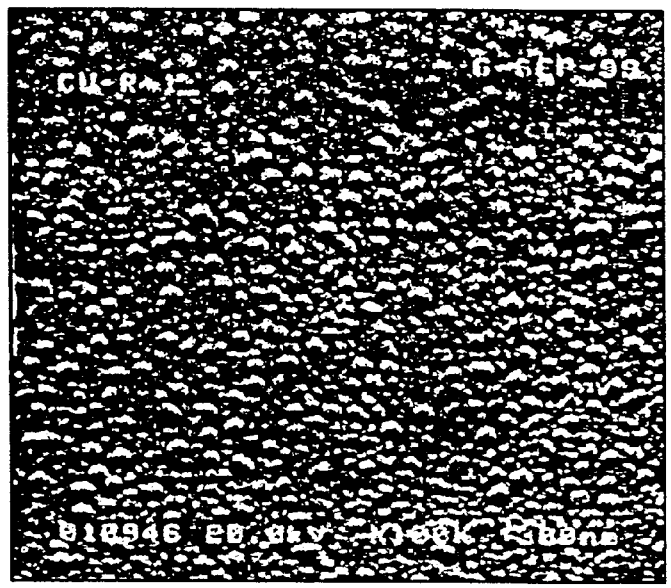
Figure 7B:
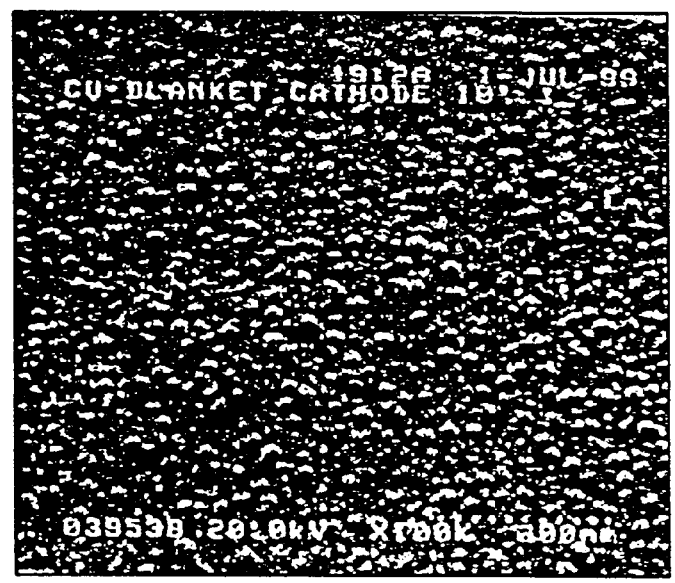

Evaluation of Copper Residue Capability of Cathode Water from Ammonium Hydroxide An oxide layer 310 (see FIG. 3A) was deposited over three semiconductor wafers to a thickness of 5,000 Å. A plurality of trenches, each having a 0.8 $\mu$m size, were formed in each of the oxide layers 310. Then, each of the trenches was filled with copper and subjected to a chemical mechanical polishing process (CMP). One of the semiconductor wafers which had undergone the CMP process was treated with the cathode water from Experimental Example 1, another with deionized water, and the remaining semiconductor wafer with hydrogen fluoride solution, each for 30 seconds. The concentrations of copper residue were measured at a plurality of points 330, as illustrated in FIG. 3A, using a total reflection X-ray fluorescence (TXRT) apparatus. In FIG. 3A, reference numeral 320 denotes individual chips. The results of the copper residue concentration measurement are illustrated in FIG. 3B. As shown in FIG. 3B, the copper residue removal capability of the cathode water is superior, and is a better removal medium than both the deionized water and hydrogen fluoride processes.

EXPERIMENTAL EXAMPLE 3

Evaluation of Damage of Layer by Cathode Wafer Electrolyzed from Ammonium Hydroxide A 2,000 Å polysilicon layer, a 1,500 Å tungsten silicide layer, a 4,000 Å tungsten layer, and a 5,000 Å copper layer were deposited onto a semiconductor wafer, and the surfaces of the layers were observed with a scanning electron microscope (SEM). The results are shown in FIGS. 4A, 5A, 6A and 7A, respectively. Then, each of the semiconductor wafers with the layers was immersed in the cathode water produced in Experimental Example 1 for 10 minutes, and the surfaces of the layers were observed with a SEM. The results are shown in FIGS. 4B, 5B, 6B and 7B, respectively. By comparing the original SEM photos of FIGS. 4A, 5A, 6A and 7A, with the post-immersion SEM photos of FIGS. 4B, 5B, 6B and 7B, it is readily apparent that no defects are shown in the surfaces of the variety of material layers exposed to the cathode water.

EXPERIMENTAL EXAMPLE 4

Figure 8A:
FIG. 8A is a SEM photo of a via immediately after the formation thereof.

Evaluation of Copper Polymer Removal Capability of Cathode Wafer Electrolyzed from Ammonium Hydroxide A copper layer as an interconnect layer, and an oxide layer were deposited on each of two semiconductor wafers, and a 0.4 $\mu$m via was formed through the oxide layer to expose the copper layer. The via was formed by dry etching using $CF_4$ gas as a reaction gas. The SEM photo immediately after the via formation is shown in FIG. 8A. As shown in FIG. 8A, a large amount of copper polymer 800 remains in the via.

Figure 8B:
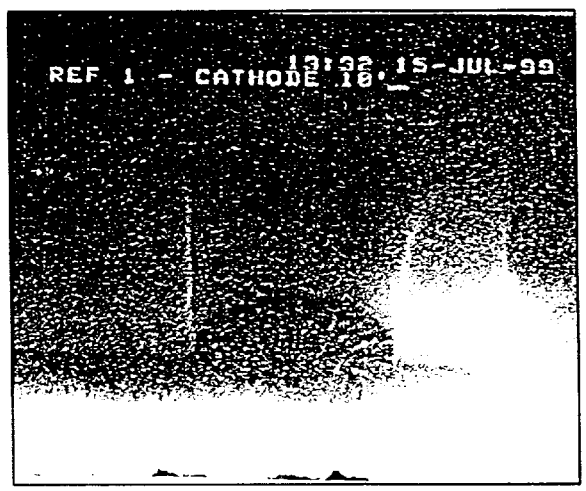
FIGS. 8B and 8C are SEM photos of the semiconductor devices with the vias after a 10-minute treatment with the reductive substance containing cathode water and oxidative substance containing anode water, respectively, hydrolyzed with 3% by weight ammonium hydroxide solution using the electrolyzer of FIG. 1A.
Figure 8C:
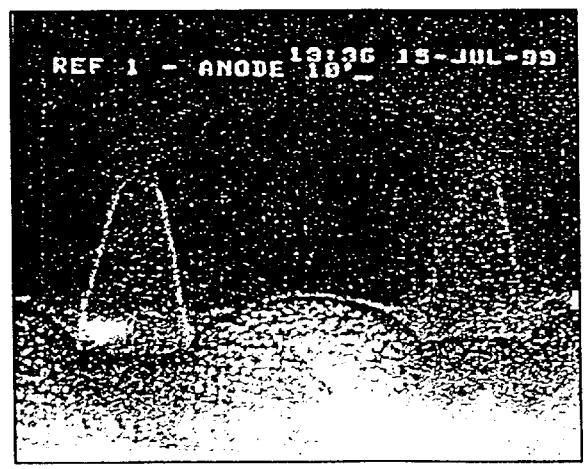

Following this, one of the two semiconductor wafers was treated with the cathode wafer produced from Experimental Example 1 for 10 minutes, and the other with the anode water produced from Experimental Example 1 for 10 minutes, with the anode water having a pH 8–9, and an ORP of +500 mVm. The results of the treatment with the cathode wafer, and with the anode water are shown in FIGS. 8B and 8C, respectively. Unlike FIG. 8A, no polymer appears in FIGS. 8B and 8C. In other words, copper polymer can be effectively removed by the cathode water and anode water according to the present invention.

EXPERIMENTAL EXAMPLE 5

Measurement of Ammonium Ion Concentrations of Cathode Water and Diluted Ammonium Hydroxide Solution at the Same pH Ammonium ion concentrations were measured by ion chromatography for: (i) the cathode water having a pH of 9–10 (produced in Experimental Example 1), (ii) the anode water having a pH of 8–9 (produced in Experimental Example 1), (iii) an ammonium hydroxide solution diluted to the same pH as the cathode water, and (iv) deionized water. The results are shown in FIG. 9. In FIG. 9, "1" denotes the deionized water, "2" denotes the cathode water, "3" denotes the anode water, and "4" denotes the diluted ammonium hydroxide solution, respectively. As shown in FIG. 9, the concentration of ammonium ions of the cathode water produced from ammonium hydroxide used as an electrolyte is markedly lower than the ammonium hydroxide solution diluted to the same pH as the cathode water. In addition, no ammonium ion is present in the anode water. This low ammonium ion concentration in the cathode water and anode water is considered as an advantage of the indirect electrolysis within the intermediate cell.

EXPERIMENTAL EXAMPLE 6

Figure 10A:
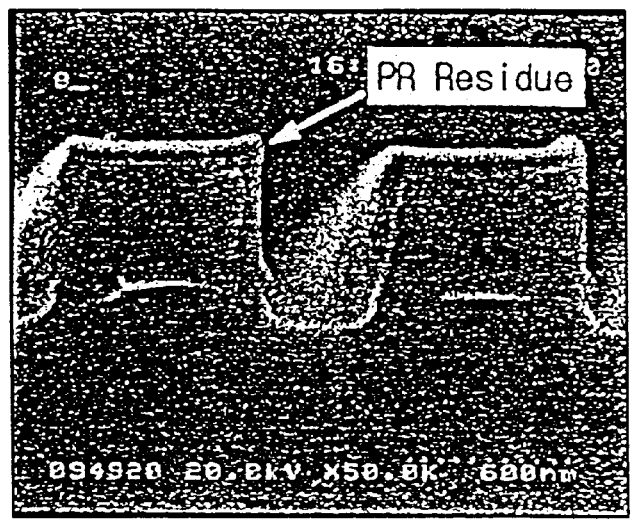
FIG. 10A is a SEM photo of an aluminum interconnect layer formed by dry etching, immediately after photoresist removal by ashing.

Evaluation of Photoresist (PR) Residue Removal Capability of Anode Water Hydrolyzed from a Mixture of Ammonium Hydroxide and Hydrogen Fluoride A 5,000 Å aluminum layer was deposited over a semiconductor wafer, and then dry etched using $BCl_3$ as a reaction gas to form an aluminum interconnect layer having a 0.6-$\mu$m width. The photoresist pattern used was stripped by dry ashing. The resultant aluminum interconnect layer was observed by a SEM as shown in FIG. 10A. A large amount of photoresist residues are shown in FIG. 10A.

Figure 10B:
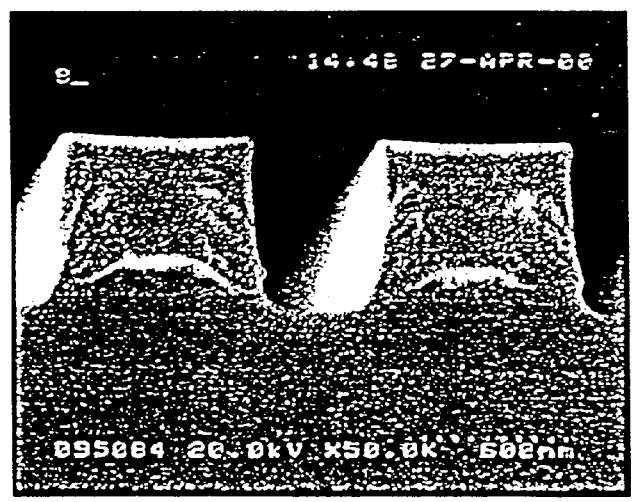
FIG. 10B is a SEM photo of the aluminum interconnect layer of FIG. 10A after a 10-minute treatment with oxidative substance containing anode water electrolyzed from a mixture of 14% by weight ammonium hydroxide and 2% by weight hydrogen fluoride solution using the electrolyzer of FIG. 1A.

A mixture of 14% by weight ammonium hydroxide and 2% by weight hydrogen fluoride solution was supplied into the intermediate cell 50, and then electrolyzed into cathode water and anode water under the same processing conditions as in Experimental Example 1. The semiconductor wafer which had undergone the ashing process was treated with the oxidative substance containing anode water for 10 minutes. The anode water used had a pH of 4–5, and an ORP of +400–+500 mV. The semiconductor water treated with the anode water was observed by a SEM as shown in FIG. 10B. As shown in FIG. 10B, the photoresist residue can be effectively removed with the anode water hydrolyzed from the mixture of ammonium hydroxide and hydrogen fluoride solution, without causing damage of the aluminum interconnect layer.

The wet processes for semiconductor device fabrication according to the present invention are readily carried out concurrently with electrolysis, with anode water containing oxidative substances and cathode water containing reductive substances, which are produced from electrolyte by a three-cell electrolyzer having an intermediate cell for the electrolyte. According to the present invention, cathode water and anode water having a desired pH level and ORP characteristic can be simultaneously produced with a small amount of electrolyte, i.e., a small amount of chemicals, and both the cathode water and anode water can be used in wet processes. The wet process efficiency can be maximized with use of a small amount of chemicals. In addition, both the reductive substance containing cathode water and the oxidative substance containing anode water are effective in removing particles, polymers, organic substances or metal particles, without causing damage to a metal layer. Therefore, the present invention can be applied to a variety of wet processes in the manufacture of semiconductor devices.

While this invention has been particularly shown and described with reference to preferred embodiments thereof, it will be understood by those skilled in the art that various changes in form and details may be made to the described embodiments without departing from the spirit and scope of the invention as defined by the appended claims.

What is claimed is:

1. A wet process performed with cathode water and anode water in the manufacture of a semiconductor device, the wet process comprising:

supplying deionized water into an anode cell and a cathode cell of a 3-cell electrolyzer;

supplying an electrolytic aqueous solution into an intermediate cell of the 3-cell electrolyzer to perform electrolysis, wherein the anode cell, the intermediate cell, and the cathode cell of the 3-cell electrolyzer are divided by ion exchange membranes, wherein the intermediate cell is interposed between the anode cell and the cathode cell, and wherein the electrolytic aqueous solution is selected from the group consisting of an ammonium hydroxide solution, a hydrochloric acid solution, and a mixture of ammonium hydroxide and a fluoride-containing solution;

producing, by the electrolysis, anode water containing oxidative substances and cathode water containing reductive substances; and using at least one of the anode water containing oxidative substances and cathode water containing reductive substances in the wet process.

2. The wet process of claim 1, wherein during the filling step, further comprising selecting a 2–15% by weight ammonium hydroxide solution as the electrolytic aqueous solution.

3. The wet process of claim 2, wherein the anode water has a pH of 7–9, and an oxidation-reduction potential of +100 mV or more.

4. The wet process of claim 2, wherein the cathode water has a pH of 9 or more, and an oxidation-reduction potential of −500 mV or less.

5. The wet process of claim 2, wherein the wet process includes one selected from a group consisting of: (i) a cleaning process performed after gate oxide layer formation, (ii) a cleaning process performed after metal layer deposition, (iii) a cleaning process performed after chemical mechanical polishing (CMP) of a metal layer, (iv) a cleaning process performed after etching of a metal layer, polysilicon layer or polysilicide layer, (v) a cleaning process performed after etching an opening through which a metal layer, polysilicon layer, or silicide layer is exposed, and (vi) a cleaning process of a layer with an underlying metal layer.

6. The wet process of claim 5, wherein the metal layer is formed from one selected from a group consisting of a copper layer, a tungsten layer, a tungsten silicide layer, a titanium layer, and titanium silicide layer.

7. The wet process of claim 2, wherein the wet process is performed with the anode water and the cathode water in sequence.

8. The wet process of claim 7, wherein the wet process is performed by repeating an alternative supply of the anode water and the cathode water.

9. The wet process of claim 1, wherein during the filling step, further comprising selecting a 3–15% by weight hydrochloric acid solution as the electrolytic aqueous solution.

10. The wet process of claim 9, wherein the anode water has a pH of 4 or less, and an oxidation-reduction potential of +700 mV or more.

11. The wet process of claim 9, wherein the cathode water has a pH of 3–5, and an oxidation-reduction potential of −100 mV or less.

12. The wet process of claim 9, wherein the wet process includes one selected from a group consisting of: (i) a cleaning process performed after gate oxide layer formation, (ii) a cleaning process performed after metal layer deposition, (iii) a cleaning process performed after chemical mechanical polishing (CMP) of a metal layer, (iv) a cleaning process performed after etching of a metal layer, polysilicon layer or polysilicide layer, (v) a cleaning process performed after etching an opening through which a metal layer, polysilicon layer, or silicide layer is exposed, and (vi) a cleaning process of a layer with an underlying metal layer.

13. The wet process of claim 12, wherein the metal layer is formed from one selected from a group consisting of a copper layer, a tungsten layer, a tungsten silicide layer, a titanium layer, and titanium silicide layer.

14. The wet process of claim 9, wherein the wet process is performed with the anode water and the cathode water in sequence.

15. The wet process of claim 14, wherein the wet process is performed by repeating an alternate supply of the anode water and the cathode water.

16. The wet process of claim 1, wherein during the filling step, further comprising selecting a mixture of 1–30% by weight ammonium hydroxide and 1–30% by weight fluoride-containing solution as the electrolytic aqueous solution.

17. The wet process of claim 16, wherein the fluoride-containing solution is one of hydrogen fluoride and ammonium fluoride.

18. The wet process of claim 16, wherein the anode water has a pH of 6 or less, and an oxidation-reduction potential of +300 mV or more.

19. The wet process of claim 16, wherein the wet process performed with the anode water containing oxidative substance includes one selected from a group consisting of: (i) a cleaning process performed after metal layer deposition, (ii) a cleaning process performed after etching of a metal layer, and (iii) a cleaning process performed after etching an opening through which a metal layer is exposed.

20. The wet process of claim 19, wherein the metal layer is formed of aluminum.

21. The wet process of claim 1, wherein the ion exchange membrane between the anode cell and the intermediate cell comprises a fluorine-based anionic exchange membrane adjacent to the anode cell, and a cationic exchange membrane adjacent to the intermediate cell.

22. The wet process of claim 1, wherein the ion exchange membrane between the cathode cell and the intermediate cell comprises an anionic exchange membrane adjacent to the cathode cell, and a cationic exchange membrane adjacent to the intermediate cell.

23. The wet process of claim 1, wherein the wet process is carried out using a simple spin apparatus, deionized water-based sonic spin apparatus, steam jet apparatus, spray apparatus, simple dip apparatus, batch-type megasonic dip apparatus, single-wafer type megasonic dip apparatus, or single-wafer type megasonic spin apparatus.

* * * * *